US012578223B2

(12) United States Patent (10) Patent No.: US 12,578,223 B2

Matsushita et al. (45) Date of Patent: Mar. 17, 2026

(54) ULTRASONIC SENSOR

(71) Applicant: Murata Manufacturing Co., Ltd., Nagaokakyo (JP)

(72) Inventors: Tomoaki Matsushita, Nagaokakyo (JP); Kazuhiro Ebara, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 298 days.

(21) Appl. No.: 18/238,769

(22) Filed: Aug. 28, 2023

(65) Prior Publication Data

US 2023/0400351 A1 Dec. 14, 2023

Related U.S. Application Data

(63) Continuation of application No. PCT/JP2022/001392, filed on Jan. 17, 2022.

(30) Foreign Application Priority Data

Mar. 2, 2021 (JP) ................................. 2021-032431

(51) Int. Cl.
G01H 11/08 (2006.01)
H10N 30/30 (2023.01)
H10N 30/88 (2023.01)

(52) U.S. Cl.
CPC ........... G01H 11/08 (2013.01); H10N 30/302 (2023.02); H10N 30/88 (2023.02)

(58) Field of Classification Search
CPC ........................................................ G01H 11/08
USPC ............................................................. 73/649
See application file for complete search history.

(56) References Cited

U.S. PATENT DOCUMENTS

| | | | | |
|---|---|---|---|---|
| 6,250,162 B1 * | 6/2001 | Amaike | .................. | G10K 9/22 |
| | | | | 310/334 |
| 2022/0057507 A1 * | 2/2022 | Satake | .................. | G01S 15/931 |
| 2022/0393096 A1 * | 12/2022 | Matsushita | ............ | H10N 30/87 |

FOREIGN PATENT DOCUMENTS

| | | | | |
|---|---|---|---|---|
| CN | 104181520 A | 12/2014 | | |
| EP | 2765789 A1 * | 8/2014 | ............. | G01H 11/08 |
| JP | 2000032594 A | 1/2000 | | |
| WO | 2013051525 A1 | 4/2013 | | |

OTHER PUBLICATIONS

International Search Report in PCT/JP2022/001392, mailed Mar. 8, 2022, 3 pages.
Written Opinion in PCT/JP2022/001392, mailed Mar. 8, 2022, 3 pages.

* cited by examiner

*Primary Examiner* — Walter L Lindsay, Jr.
*Assistant Examiner* — Philip T Fadul
(74) *Attorney, Agent, or Firm* — Keating & Bennett, LLP

(57) ABSTRACT

An ultrasonic sensor includes a housing, a piezoelectric element on a bottom plate inside the housing, a signal terminal, and a flexible circuit. The flexible circuit is connected to the piezoelectric element and to an end portion of the signal terminal. A side wall includes a pair of thicker portions that oppose each other and a pair of thinner portions with a thickness less than that of the pair of thicker portions and that oppose each other. At least one of the thicker portions includes a recess at an inner surface thereof, and a portion of the flexible circuit is positioned inside the recess.

11 Claims, 9 Drawing Sheets

FIG.12
FIG.13
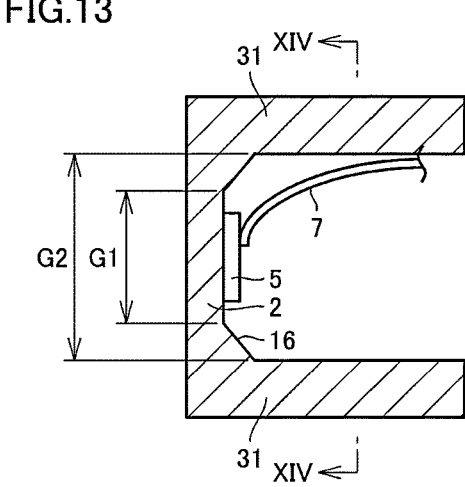
FIG.14
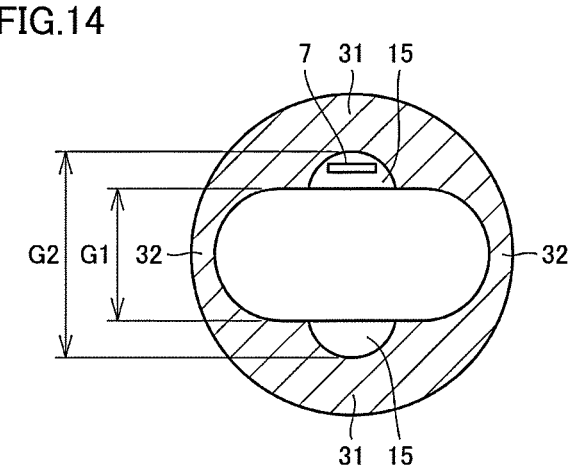

FIG.19

ULTRASONIC SENSOR

CROSS REFERENCE TO RELATED APPLICATIONS

This application claims the benefit of priority to Japanese Patent Application No. 2021-032431 filed on Mar. 2, 2021 and is a Continuation Application of PCT Application No. PCT/JP2022/001392 filed on Jan. 17, 2022. The entire contents of each application are hereby incorporated herein by reference.

BACKGROUND OF THE INVENTION

1. Field of the Invention

The present invention relates to an ultrasonic sensor.

2. Description of the Related Art

An ultrasonic sensor including a housing and a piezoelectric element is known. The housing has a bottom plate and a side wall and is shaped like a hollow cylinder having the bottom. The piezoelectric element is disposed on a bottom surface inside the housing. One example of such an ultrasonic sensor is disclosed in International Publication No. WO2013/051525.

Nowadays, automobiles are equipped with automatic maneuvering functions, such as autonomous parking and autonomous braking at a low speed. Ultrasonic sensors are used to implement such functions. In this case, the ultrasonic sensors are expected to be capable of high accuracy detection and high performance detection in a short distance. In order to implement high performance detection in a short distance, the reverberation time of the ultrasonic sensor needs to be short. The "reverberation time" here means a duration between the point at which a drive signal to drive the piezoelectric element stops and the point at which the piezoelectric element stops vibrating. If the intensity of vibration at a spurious frequency, or a residual vibration, is small, the reverberation time becomes short.

In order to implement high accuracy detection, the ultrasonic sensor needs to have a wide horizontal directivity. The horizontal directivity varies depending on the shape of the housing of the ultrasonic sensor. If the distance between thick portions of the housing that oppose each other is small, the horizontal directivity becomes wide.

The ultrasonic sensor described in International Publication No. WO2013/051525 includes a piezoelectric element disposed on the bottom surface inside the housing and a pin terminal of which the tip end protrudes out of the housing. The ultrasonic sensor further includes a flexible circuit that connects the piezoelectric element and the pin terminal to each other. If the distance between the thick portions that oppose each other is small in order to obtain a wide horizontal directivity, the piezoelectric element may be displaced from a desired position due to a reaction force exerted by the flexible circuit during the manufacture of the ultrasonic sensor. If the piezoelectric element is displaced from the desired position, the intensity of vibration at a spurious frequency increases, which causes the reverberation time to increase and thus impairs the detection performance of the ultrasonic sensor in short distance. The ultrasonic sensor described in International Publication No. WO2013/051525 has such a shortcoming.

SUMMARY OF THE INVENTION

Preferred embodiments of the present invention provide ultrasonic sensors each with high accuracy detection and high performance detection in a short distance.

An ultrasonic sensor according to a preferred embodiment of the present invention includes a housing including a side wall with a hollow cylinder shape and a bottom plate at one end of the side wall, a piezoelectric element on the bottom plate inside the housing, a signal terminal including one end portion positioned inside the housing and another end portion positioned outside the housing, and a flexible circuit connected to the piezoelectric element and to the one end portion of the signal terminal. The side wall includes a pair of thicker portions opposed to each other and a pair of thinner portions opposed to each other and having a thickness less than that of the pair of thicker portions. At least one of the thicker portions includes a recess at an inner surface thereof, and a portion of the flexible circuit is positioned inside the recess.

Preferred embodiments of the present invention provide ultrasonic sensors each with high accuracy detection and high performance detection in a short distance.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 12 is a second cross-sectional view illustrating Sample 2 used in simulation.

FIG. 13 is a first cross-sectional view illustrating Sample 3 used in simulation.

FIG. 14 is a second cross-sectional view illustrating Sample 3 used in simulation.

FIG. 19 is a plan view illustrating a housing of an ultrasonic sensor according to Preferred Embodiment 6 of the present invention.

DETAILED DESCRIPTION OF THE PREFERRED EMBODIMENTS

Figure 1:
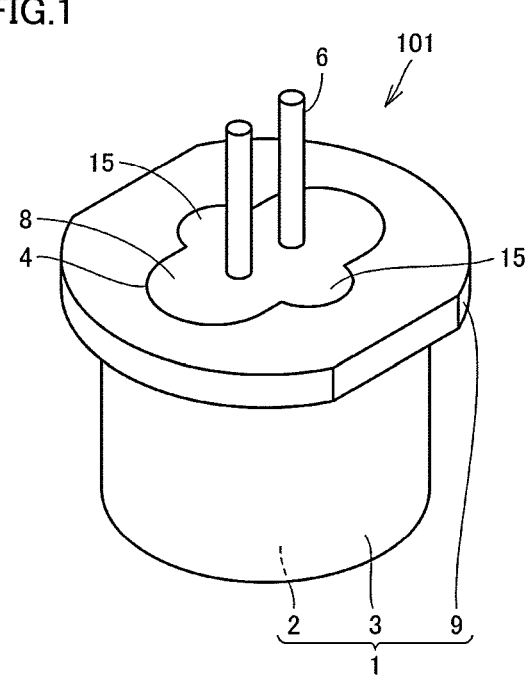
FIG. 1 is a perspective view illustrating an ultrasonic sensor according to Preferred Embodiment 1 of the present invention.

Preferred embodiments of the present invention will be described in detail below with reference to the drawings.

In the drawings, dimensional ratios of illustrated objects may be exaggerated to facilitate better understanding and do not necessarily reflect actual ratios. In the following description, concepts related to "up" or "down" do not necessarily indicate the absolute position/orientation of an object but may indicate the position/orientation relative to a particular illustration of the object.

Preferred Embodiment 1

Figure 2:
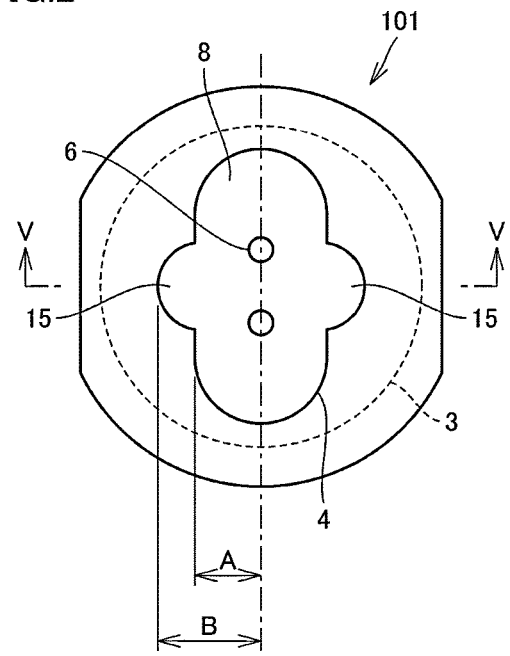
FIG. 2 is a plan view illustrating the ultrasonic sensor according to Preferred Embodiment 1 of the present invention.
Figures 3, 4:
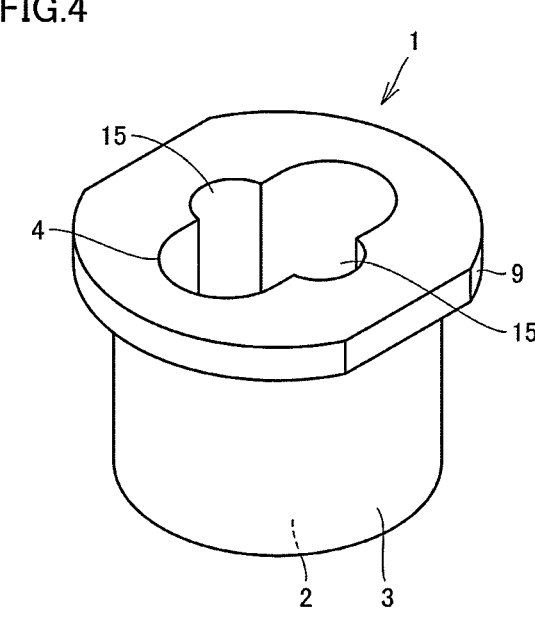
FIG. 3 is a side view illustrating the ultrasonic sensor according to Preferred Embodiment 1 of the present invention.
FIG. 4 is a perspective view illustrating a housing of the ultrasonic sensor according to Preferred Embodiment 1 of the present invention.
Figures 5, 6:
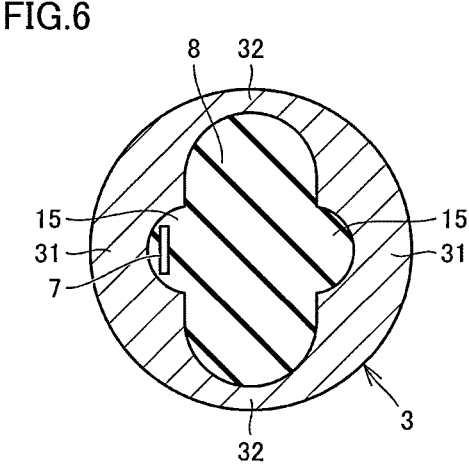
FIG. 5 is a first cross-sectional view illustrating the ultrasonic sensor according to Preferred Embodiment 1 of the present invention.
FIG. 6 is a second cross-sectional view illustrating the ultrasonic sensor according to Preferred Embodiment 1 of the present invention.
Figure 7:
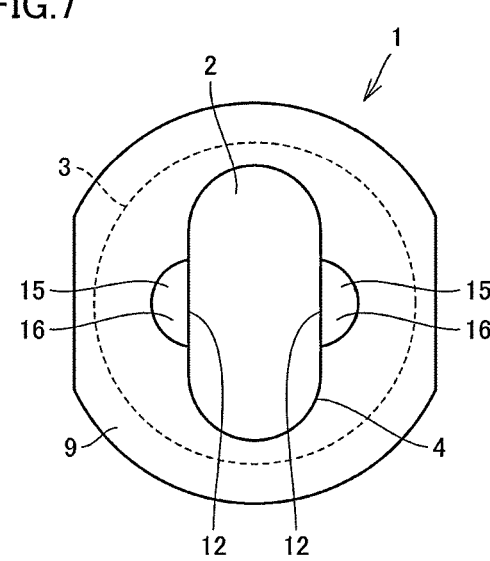
FIG. 7 is a plan view illustrating a housing of the ultrasonic sensor according to Preferred Embodiment 1 of the present invention.

An ultrasonic sensor according to Preferred Embodiment 1 of the present invention will be described with reference to FIGS. 1 to 8. FIG. 1 is a perspective view illustrating an ultrasonic sensor 101 of the present preferred embodiment. FIG. 2 is a plan view illustrating the ultrasonic sensor 101. FIG. 3 is a side view illustrating the ultrasonic sensor 101. FIG. 4 is a perspective view illustrating a housing 1 included in the ultrasonic sensor 101. FIG. 5 is a first cross-sectional view of the ultrasonic sensor 101 taken along line V-V and viewed in the arrow direction in FIG. 2. FIG. 6 is a second cross-sectional view of the ultrasonic sensor 101 taken along line VI-VI and viewed in the arrow direction in FIG. 3. FIG. 7 is a plan view illustrating the housing 1 included in the ultrasonic sensor 101.

As illustrated in FIGS. 1 to 7, the ultrasonic sensor 101 includes a housing 1, a piezoelectric element 5, pin terminals 6, and a flexible circuit 7. The housing 1 includes a bottom plate 2 and a side wall 3. The side wall 3 has a hollow cylinder shape. The bottom plate 2 is provided at one end of the side wall 3. The other end of the side wall 3 is an opening 4. Accordingly, the housing 1 is shaped like a hollow cylinder including the bottom. The housing 1 includes a flange 9. The flange 9 projects outward at the end of the side wall 3 opposite to the end including the bottom plate 2, in other words, at the end of the side wall 3 including the opening 4. For example, the housing 1 is made of a metal, such as aluminum. For example, the housing 1 is integrally provided. The piezoelectric element 5 is disposed on the bottom plate 2 inside the housing 1. Each of the pin terminals 6 is disposed such that one end is positioned inside the housing 1 and the other end is positioned outside the housing 1. The flexible circuit 7 is shaped like a belt. As illustrated in FIGS. 1 and 2, the ultrasonic sensor 101 includes two pin terminals 6. These pin terminals 6 are signal terminals. The ultrasonic sensor 101 may include two extension terminals defining and functioning as signal terminals in place of the two pin terminals 6. Each of the extension terminals is disposed such that one end is positioned inside the housing 1 and the other end is positioned outside the housing 1. As illustrated in FIG. 5, a damping material 8 is packed in the inside space of the housing 1. The damping material 8 is also an insulating material.

Figure 8:
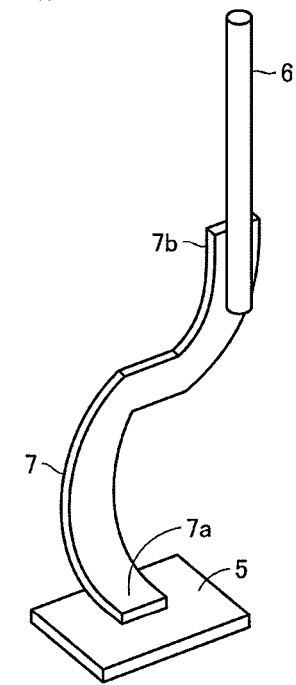
FIG. 8 is a perspective view illustrating a piezoelectric element, a pin terminal, and a flexible circuit of the ultrasonic sensor according to Preferred Embodiment 1 of the present invention.

FIG. 8 is a perspective view illustrating the piezoelectric element 5, the pin terminal 6, and the flexible circuit 7 when these elements are removed from the housing 1. The flexible circuit 7 illustrated in FIG. 8 has a bent shape, which is one example of the shape. The flexible circuit 7 may have a straight shape or a broken line shape, for example. The flexible circuit 7 is accommodated in the housing 1 in the state of the flexible circuit 7 being elastically deformed or bent. The flexible circuit 7 includes a first end portion 7a connected to the piezoelectric element 5 and a second end portion 7b connected to one end portion of the pin terminal 6. One of the two pin terminals 6 is connected to the piezoelectric element 5 via the flexible circuit 7. As illustrated in FIG. 6, the side wall 3 includes a pair of thick portions 31 that oppose each other and a pair of thin portions 32 that oppose each other. The direction in which the thick portions 31 oppose each other orthogonally or substantially orthogonally intersects the direction in which the thin portions 32 oppose each other. In other words, the pair of the thick portions 31 is disposed in the direction shifted by about degrees from the direction in which the pair of the thin portions 32 is disposed.

As illustrated in FIGS. 5 to 7, recesses 15 are provided at respective inner surfaces of the thick portions 31. Each recess is provided in a thick portion 31 so as to extend from the end of the thick portion 31 at the opening 4 to a position near the end thereof at the bottom plate 2. Accordingly, when the housing 1 is viewed in the direction from the opening 4 toward the bottom plate 2 as illustrated in FIG. 7, the inner surface of the recess is positioned closer to the outer surface of the housing 1, than a boundary 12 between the inner surface of the bottom plate 2 and the inner surface of the thick portion 31. As illustrated in FIGS. 5 and 6, a portion of the flexible circuit 7 is positioned inside the recess 15.

As illustrated in FIG. 7, each recess 15 is positioned in a central region of each thick portion 31 when the housing 1 is viewed in the direction from the opening 4 toward the bottom plate 2. The "central region" of the thick portion 31 as used above is defined with respect to the direction in which the thin portions 32 oppose each other. When the housing 1 is viewed in the direction from the opening 4 toward the bottom plate 2 as illustrated in FIG. 2 and a center line extends in a direction orthogonal or substantially orthogonal to the direction in which the thick portions 31 oppose each other, the distance from the center line to the inner surface of the recess 15 is denoted by B, and the distance from the center line to the inner surface of the thick portion 31 at a position where the recess 15 is not present is denoted by A. In this case, A<B is satisfied. The distance between the thick portions 31 is 2A. Here, the distance between the thick portions 31 is the distance between respective inner surfaces of the thick portions 31 at positions where the recesses 15 are not present. If the distance between the thick portions 31 is small, the ultrasonic sensor 101 exhibits a wide horizontal directivity.

According to the present preferred embodiment, the recess 15 is provided at the inner surface of each thick portion 31, and a portion of the flexible circuit 7 is positioned inside the recess 15, which can alleviate warping of the flexible circuit 7 caused by elastic deformation. Accordingly, even if the distance between the thick portions 31 is small in order to obtain a wide horizontal directivity, this can reduce the likelihood of the piezoelectric element 5 being displaced from a desired position due to a reaction force exerted by the flexible circuit 7 during the manufacture of the ultrasonic sensor 101. Accordingly, the ultrasonic sensor 101 of the present preferred embodiment can exhibit a wide horizontal directivity and high accuracy of detection due to the distance between the thick portions 31 being small. Moreover, in the present preferred embodiment, the piezoelectric element 5 is disposed accurately at a desired position in the ultrasonic sensor 101, which can reduce the vibration strength at a spurious frequency and shorten the reverberation time, leading to high performance in the short-range detection. As a result, the ultrasonic sensor 101 of the present preferred embodiment is capable of high accuracy detection and high performance detection in a short distance.

As described in the present preferred embodiment, the recess 15 is preferably provided at the central region of each thick portion 31 when the housing 1 is viewed in the direction from the opening 4 toward the bottom plate 2. Put another way, the recess 15 is preferably provided in a region that includes the center of the thick portion 31 when the housing 1 is viewed in the direction from the opening 4 toward the bottom plate 2. Accordingly, the recess 15 that can accommodate a portion of the flexible circuit 7 can be provided without significantly changing the shape of the thick portion 31.

As described in the present preferred embodiment, the recess 15 includes a portion that is gradually recessed shallower from the inner surface of each thick portion as the distance to the bottom plate 2 is reduced. In other words, the thick portion 31 includes an inclined portion 16. In the present preferred embodiment, as illustrated in FIG. 5, when a region of the side wall 3, the region extending from the end at the opening 4 to the end at the bottom plate 2, is denoted by D, the recess 15 is provided over the entire or substantially the entire region D. When a region of the side wall 3, the region being closer to the bottom plate 2, is denoted by C, the inclined portion 16 is provided in the region C. With this configuration, the recess that can accommodate a portion of the flexible circuit 7 can be provided without changing the shape of the inner surface of the bottom plate 2.

As described in the present preferred embodiment, it is preferable to provide the recesses 15 in respective thick portions 31 at symmetrical or substantially symmetrical positions when the housing 1 is viewed in the direction from the opening 4 toward the bottom plate 2. This enables the housing 1 to be shaped symmetrically or substantially symmetrically, which is convenient because it is not necessary to take into account of the orientation of the housing 1 during manufacturing.

The symmetrical or substantially symmetrical shape stabilizes the vibration of the housing 1.

Simulation

Figure 9:
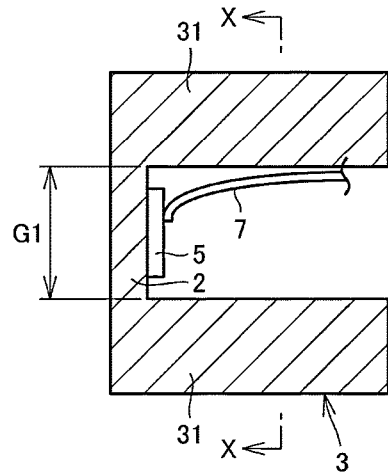
FIG. 9 is a first cross-sectional view illustrating Sample 1 used in simulation.
Figure 10:
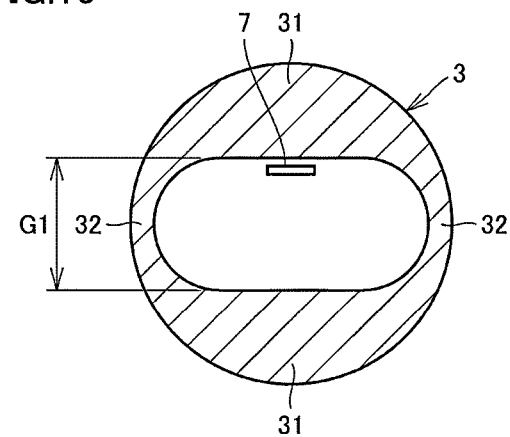
FIG. 10 is a second cross-sectional view illustrating Sample 1 used in simulation.
Figure 11:
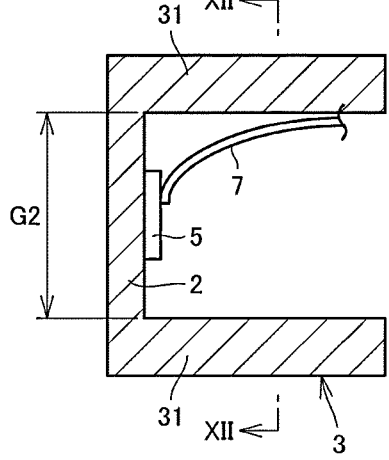
FIG. 11 is a first cross-sectional view illustrating Sample 2 used in simulation.

To investigate advantageous effects of preferred embodiments of the present invention, three simulation models of the ultrasonic sensor, in other words, Samples 1 to 3, were developed, and the horizontal directivity of these models were calculated using the finite element method. The shape of the housing 1 is different in Samples 1 to 3. FIG. 9 is a first cross-sectional view of Sample 1. FIG. 10 is a second cross-sectional view of Sample 1 taken along line X-X and viewed in the arrow direction in FIG. 9. FIG. 11 is a first cross-sectional view of Sample 2. FIG. 12 is a second cross-sectional view of Sample 2 taken along line XII-XII and viewed in the arrow direction in FIG. 11. FIG. 13 is a first cross-sectional view of Sample 3. FIG. 14 is a second cross-sectional view of Sample 3 taken along line XIV-XIV and viewed in the arrow direction in FIG. 13. In Samples 1 to 3, the vibration frequency of a vibrating portion was set to be about 62 kHz, for example. The vibrating portion is mainly the bottom plate 2 but is not limited thereto. Samples 1 and 2 are based on a known art, and the present invention is not applied thereto. In Sample 1, a distance G1 between the thick portions was set to be about 7 mm. In Sample 2, the distance between the thick portions was set to be greater than that of Sample 1 in order to alleviate the warping of the flexible circuit without applying the present invention. In Sample 2, a distance G2 between the thick portions was set to be about 8 mm. Accordingly, G2 is greater than G1 (G2>G1). Sample 3 is an example to which the present invention is applied. In Sample 3, G1 is the distance between the inner surfaces of respective thick portions 31 at positions where the recesses 15 are not present. The distance G1 here is the same as the above-described G1. In Sample 3, G2 is the distance between the inner surfaces of respective recesses 15. The distance G2 here is the same as the above-described G2. In Sample 3, the angle between the inclined portion 16 and the inner surface of the bottom plate 2 was set to be about 40 degrees. The angle representing the horizontal directivity was obtained from the simulation. The results are collated in Table 1.

TABLE 1

|  | Sample 1 | Sample 2 | Sample 3 |
| --- | --- | --- | --- |
| Frequency (kHz) | 62 | 62 | 62 |
| Angle representing horizontal directivity (degrees) | 70.2 | 64.2 | 69.4 |
| Change in angle representing horizontal directivity (degrees) | — | −6.0 | −0.7 |

The "angle representing the horizontal directivity" means an angle between limits at which the sound pressure level attenuates by about 3 dB. The angle representing the horizontal directivity of Sample 2 became substantially smaller than that of Sample 1. Accordingly, the horizontal directivity of Sample 2 became small compared with Sample 1. However, in Sample 3, which corresponds to the ultrasonic sensor according to the present preferred embodiment, the angle representing the horizontal directivity became only slightly smaller than that of Sample 1. Accordingly, the horizontal directivity of Sample 3 is almost at the same level as that of Sample 1.

Preferred Embodiment 2

Figures 15, 16:
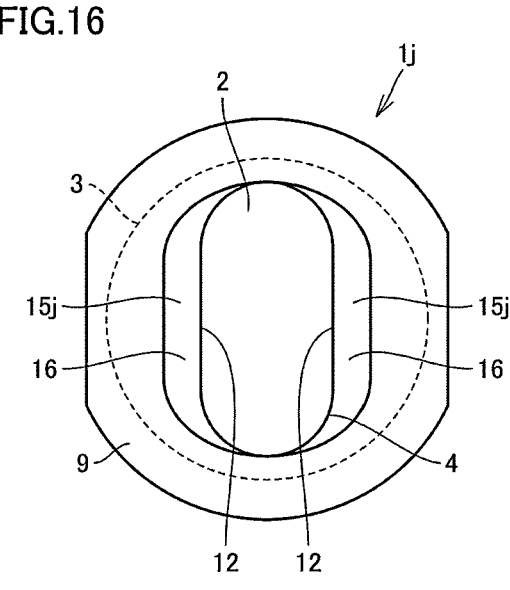
FIG. 15 is a plan view illustrating a housing of an ultrasonic sensor according to Preferred Embodiment 2 of the present invention.
FIG. 16 is a plan view illustrating a housing of an ultrasonic sensor according to Preferred Embodiment 3 of the present invention.

An ultrasonic sensor according to Preferred Embodiment 2 of the present invention will be described with reference to FIG. 15. FIG. 15 is a plan view illustrating a housing 1*i* included in the ultrasonic sensor of Preferred Embodiment 2. The ultrasonic sensor of the present preferred embodiment includes the housing 1*i* instead of the housing 1. As illustrated in FIG. 7, when the housing 1 of Preferred Embodiment 1 is viewed in the direction from the opening 4 toward the bottom plate 2, the recesses 15 having semicircular or substantially semicircular shapes are provided in the housing 1. In the present preferred embodiment, however, recesses 15*i* provided in the housing 1*i* are rectangular or substantially rectangular as illustrated in FIG. 15 when the housing 1*i* is viewed in the direction from the opening 4 toward the bottom plate 2. Other structures of the ultrasonic sensor of the present preferred embodiment are the same as or similar to those described in Preferred Embodiment 1, and duplicated descriptions will be omitted.

The advantageous effects the same as or similar to those in Preferred Embodiment 1 can be obtained also in the present preferred embodiment.

Preferred Embodiment 3

An ultrasonic sensor according to Preferred Embodiment 3 of the present invention will be described with reference to FIG. 16. FIG. 16 is a plan view illustrating a housing 1*j* included in the ultrasonic sensor of Preferred Embodiment 3. The ultrasonic sensor of the present preferred embodiment includes the housing 1*j* instead of the housing 1. As illustrated in FIG. 7, when the housing 1 of Preferred Embodiment 1 is viewed in the direction from the opening 4 toward the bottom plate 2, each recess 15 is provided in the central region of the thick portion 31, the central region being defined in the direction in which the thin portions 32 oppose each other. In the housing 1*j* of the present preferred embodiment, however, recesses 15*j* are provided in respective thick portions 31 so as to extend in the direction in which the thin portions 32 oppose each other as illustrated in FIG. 16 when the housing 1*j* is viewed in the direction from the opening 4 toward the bottom plate 2. Other structures of the ultrasonic sensor of the present preferred embodiment are the same as or similar to those described in Preferred Embodiment 1, and duplicated descriptions will be omitted.

The advantageous effects the same as or similar to those in Preferred Embodiment 1 can be obtained also in the present preferred embodiment.

The shapes of the recesses illustrated in FIGS. 7, 15, and 16 are merely examples. The recesses may have different shapes.

Preferred Embodiment 4

Figures 17, 18:
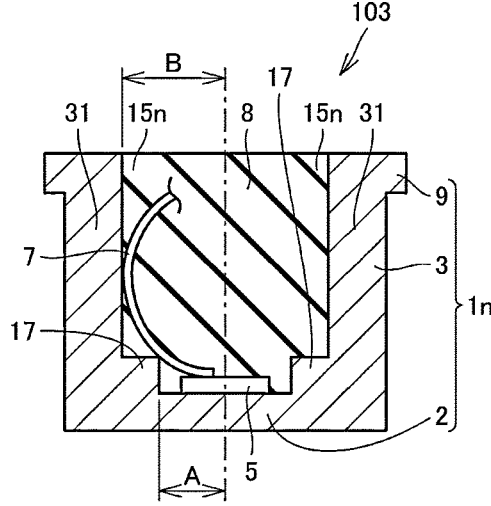
FIG. 17 is a cross-sectional view illustrating an ultrasonic sensor according to Preferred Embodiment 4 of the present invention.
FIG. 18 is a cross-sectional view illustrating an ultrasonic sensor according to Preferred Embodiment 5 of the present invention.

An ultrasonic sensor according to Preferred Embodiment 4 of the present invention will be described with reference to FIG. 17. FIG. 17 is a cross-sectional view illustrating a housing 1*k* included in the ultrasonic sensor of Preferred Embodiment 4. An ultrasonic sensor 102 of the present preferred embodiment includes the housing 1*k* instead of the housing 1. In the housing 1*k* of the present preferred embodiment, however, each recess 15*k* is provided in an entire or substantially an entire region of the side wall 3, the region extending from the end at the opening 4 to the end at the bottom plate 2 as illustrated in FIG. 17. In addition, each inclined portion 16 is provided in the recess 15*k* in the entire or substantially the entire region of the side wall 3 from the end at the opening 4 to the end at the bottom plate 2. Although each inclined portion 16 is inclined entirely at a constant or substantially constant angle in the present preferred embodiment, the inclination angle of the inclined portion may vary in the middle. Other structures of the ultrasonic sensor 102 are the same as or similar to those described in Preferred Embodiment 1, and duplicated descriptions will be omitted.

The advantageous effects the same as or similar to those in Preferred Embodiment 1 can be obtained also in the present preferred embodiment.

Preferred Embodiment 5

An ultrasonic sensor according to Preferred Embodiment 5 of the present invention will be described with reference to FIG. 18. FIG. 18 is a cross-sectional view illustrating a housing 1*n* included in the ultrasonic sensor of Preferred Embodiment 5. An ultrasonic sensor 103 of the present preferred embodiment includes the housing 1*n* instead of the housing 1. In the housing 1*n* of the present preferred embodiment, however, recesses 15*n* are not provided in the entire or substantially the entire region of the side wall 3 from the end at the opening 4 to the end at the bottom plate 2, as illustrated in FIG. 18. The recesses 15*n* are provided only in an upper region above a specific point. A step portion 17 is provided between each recess 15*n* and the bottom plate 2. Other structures of the ultrasonic sensor 103 are the same as or similar to those described in Preferred Embodiment 1, and duplicated descriptions will be omitted.

The advantageous effects the same as or similar to those in Preferred Embodiment 1 can be obtained also in the present preferred embodiment. In the present preferred embodiment, the step portion 17 is described, by way of example, as including only one step. The step portion, however, may has a stair shape including two steps or more.

The cross-sectional shapes of the recesses illustrated in FIGS. 5, 17, and 18 are merely examples and the recesses may have different cross-sectional shapes.

Preferred Embodiment 6

Figure 19:
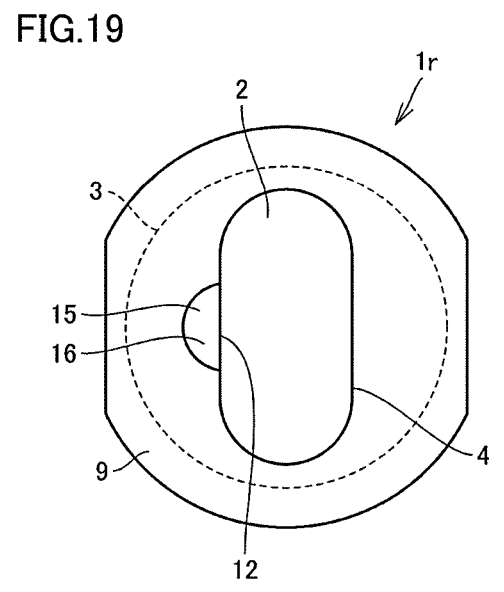

An ultrasonic sensor according to Preferred Embodiment 6 of the present invention will be described with reference to FIG. 19. FIG. 19 is a plan view illustrating a housing 1*r* included in the ultrasonic sensor of Preferred Embodiment 6. The ultrasonic sensor of the present preferred embodiment includes the housing 1*r* instead of the housing 1. As illustrated in FIG. 7, when the housing 1 of Preferred Embodiment 1 is viewed in the direction from the opening 4 toward the bottom plate 2, the recesses 15 are provided symmetrically or substantially symmetrically in respective thick portions 31. In the housing 1*r* of the present preferred embodiment, however, the recess 15 is provided in only one of the thick portions 31 as illustrated in FIG. 19 when the housing 1*r* is viewed in the direction from the opening 4 toward the bottom plate 2. Other structures of the ultrasonic sensor of the present preferred embodiment are the same as or similar to those described in Preferred Embodiment 1, and duplicated descriptions will be omitted.

The advantageous effects the same as or similar to those in Preferred Embodiment 1 can be obtained also in the present preferred embodiment.

The above preferred embodiments may be combined with one another.

The above preferred embodiments disclosed herein are construed as examples and not as limiting in all aspects. The scope of the present invention is intended to be defined by the scope of the claims, in which any variations and equivalents are included.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An ultrasonic sensor comprising:
   a housing including a side wall with a hollow cylinder shape and a bottom plate at one end of the side wall;
   a piezoelectric element on the bottom plate inside the housing;

a signal terminal including one end portion inside the housing and another end portion outside the housing; and a flexible circuit connected to the piezoelectric element and to the one end portion of the signal terminal; wherein the side wall includes a pair of thicker portions opposed to each other and a pair of thinner portions opposed to each other and having a thickness less than that of the pair of thicker portions;

at least one of the thicker portions includes a recess at an inner surface thereof;

a portion of the flexible circuit is positioned inside the recess;

the another end of the side wall is an opening; and when the housing is viewed in a direction from the opening toward the bottom plate, an inner surface of the recess is positioned closer to an outer surface of the housing than a boundary between an inner surface of the bottom plate and the inner surface of the at least one of the thicker portions.

2. The ultrasonic sensor according to claim 1, wherein the recess is provided in a central region of each one of the thicker portions when the housing is viewed in the direction from the opening toward the bottom plate.

3. The ultrasonic sensor according to claim 1, wherein recess includes a portion that is recessed shallower from the inner surface of a corresponding one of the thicker portions as a distance from the bottom plate decreases.

4. The ultrasonic sensor according to claim 1, wherein the recess is provided in respective ones of the thicker portions at symmetrical or substantially symmetrical positions when the housing is viewed in the direction from the opening toward the bottom plate.

5. The ultrasonic sensor according to claim 1, further comprising a damping material inside the housing.

6. The ultrasonic sensor according to claim 1, wherein the flexible circuit board is bent.

7. The ultrasonic sensor according to claim 1, wherein the recess has a semicircular or substantially semicircular shape when the housing is viewed in the direction from the opening toward the bottom plate.

8. The ultrasonic sensor according to claim 1, wherein the recess has a rectangular or substantially rectangular shape when the housing is viewed in the direction from the opening toward the bottom plate.

9. The ultrasonic sensor according to claim 1, wherein the recess is provided in respective thicker portions so as to extend in a direction in which the thinner portions oppose each other.

10. The ultrasonic sensor according to claim 1, wherein the recess is provided in an entire or substantially an entire region of the side wall.

11. The ultrasonic sensor according to claim 1, wherein the recess is provided only in an upper region of the side wall.

* * * * *